(12) United States Patent
Tokuda (10) Patent No.: US 10,825,883 B2
(45) Date of Patent: Nov. 3, 2020

(54) ORGANIC EL DISPLAY DEVICE

(71) Applicant: Japan Display Inc., Minato-ku (JP)

(72) Inventor: Naoki Tokuda, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/640,789

(22) Filed: Jul. 3, 2017

(65) Prior Publication Data

US 2018/0061924 A1 Mar. 1, 2018

(30) Foreign Application Priority Data

Aug. 24, 2016 (JP) ................................ 2016-163635

(51) Int. Cl.
- *H01L 27/32* (2006.01)
- *H01L 51/52* (2006.01)
- *G09G 3/3233* (2016.01)

(52) U.S. Cl.
CPC ....... *H01L 27/3276* (2013.01); *G09G 3/3233* (2013.01); *H01L 27/3246* (2013.01); *H01L 27/3248* (2013.01); *H01L 51/5203* (2013.01); *H01L 51/5206* (2013.01); *G09G 2300/0842* (2013.01); *G09G 2320/045* (2013.01)

(58) Field of Classification Search
CPC .................................................. H01L 27/3248
See application file for complete search history.

(56) References Cited

U.S. PATENT DOCUMENTS

| 9,231,043 | B2* | 1/2016 | Sato | .................. | H01L 27/3276 |
| 2006/0202610 | A1* | 9/2006 | Karasawa | ........... | H01L 51/5284 |
| | | | | | 313/498 |
| 2014/0284579 | A1* | 9/2014 | Tokuda | .............. | H01L 27/3265 |
| | | | | | 257/40 |
| 2015/0060822 | A1* | 3/2015 | Kamiya | .............. | H01L 51/5225 |
| | | | | | 257/40 |
| 2015/0206928 | A1* | 7/2015 | Kimura | .............. | H01L 27/3246 |
| | | | | | 257/88 |

FOREIGN PATENT DOCUMENTS

| JP | 2015-135615 | 7/2015 |
| KR | 10-2014-0126861 A | 11/2014 |
| KR | 10-2015-0040668 A | 4/2015 |

OTHER PUBLICATIONS

Combined Taiwanese Office Action and Search Report dated Jun. 6, 2018 in Patent Application No. 106122641 (with English language translation).

(Continued)

*Primary Examiner* — Kenneth Parker
*Assistant Examiner* — Christopher A Culbert
(74) *Attorney, Agent, or Firm* — Oblon, McClelland, Maier & Neustadt, L.L.P.

(57) ABSTRACT

An organic EL display device according to an embodiment of the present invention includes: an ITO layer divided and disposed in a region where a pixel opening is formed; a capacitance insulating film disposed on the ITO layer; a lower electrode disposed on the capacitance insulating film; an organic layer disposed on the lower electrode; an upper electrode disposed on the organic layer; and a planarizing member disposed so as to soften a step of a step part of the lower electrode.

20 Claims, 9 Drawing Sheets

(56) References Cited

OTHER PUBLICATIONS

Office Action dated Apr. 8, 2019 in Taiwanese Patent Application No. 106122641 (with English translation).
Office Action dated Nov. 20, 2018 in Taiwanese Application No. 106122641 (w/English translation).
Korean Office Action dated Jun. 28, 2018 in Korean Patent Application No. 10-2017-0085425 (with English abstract), 9 pages.
Office Action dated Aug. 25, 2020 in Japanese Application No. 2016-163635.

* cited by examiner

ORGANIC EL DISPLAY DEVICE

CROSS-REFERENCE TO RELATED APPLICATION

The present application claims priority from Japanese Application JP2016-163635 filed on Aug. 24, 2016, the content of which is hereby incorporated by reference into this application.

BACKGROUND OF THE INVENTION

1. Field of the Invention

One or more embodiments of the present invention relate to an organic EL display device.

2. Description of the Related Art

Figure 8:
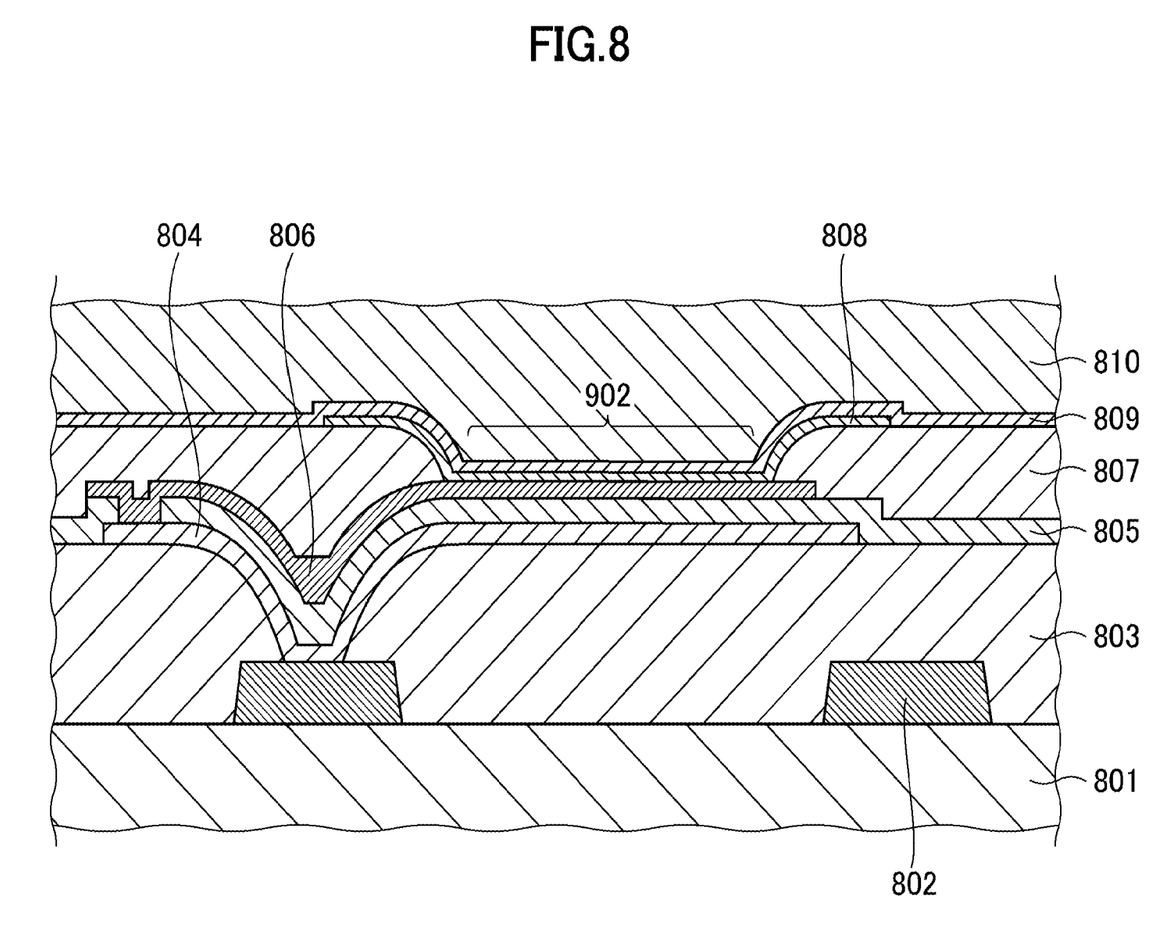
FIG. 8 is a diagram illustrating an example of a cross section around a pixel opening of an organic EL display device as a comparative example regarding the present invention.
Figure 9:
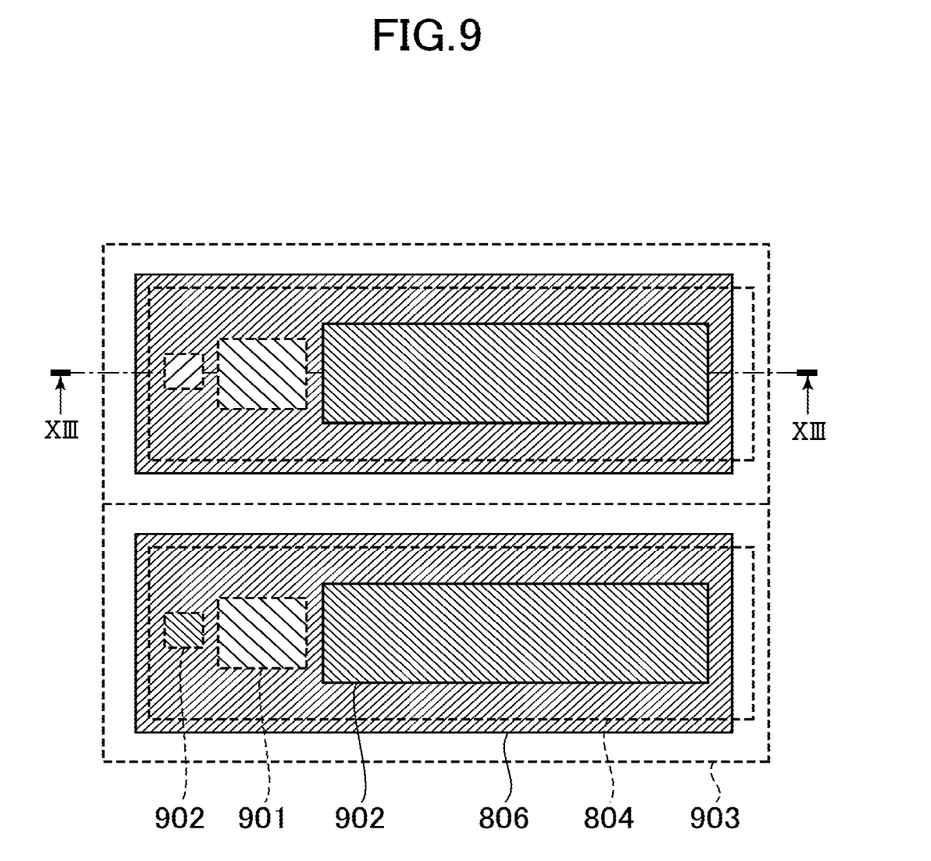
FIG. 9 illustrates an example of a planar view of the configuration of FIG. 8.

On an organic EL display device, there is a case where a pixel opening is formed by a rib that separates each of pixels. Specifically, for example, the organic EL display device as described above has a configuration as illustrated in FIG. 8 and FIG. 9. FIG. 8 illustrates an example of a cross section of a region around the pixel opening, and FIG. 9 illustrates a planar view of the configuration illustrated in FIG. 8. Further, FIG. 8 illustrates an example of XIII-XIII cross section of FIG. 9.

As illustrated in FIGS. 8 and 9, a line 802 is separately disposed at predetermined intervals on an array substrate 801 on which TFT and the like are formed. On the array substrate 801 where the line 802 is formed, a planarizing film 803 is formed. An ITO layer 804 is formed over an opening part 901 formed on the planarizing film 803 on the line 802. The ITO layer 804 is formed so as to extend from the line 802 and pass under the pixel opening 902.

In a region on the left side of FIG. 8 where the line 802 is formed, the opening part 901 is formed on the planarizing film 803, and in the opening part 901, primarily, the ITO layer 804, a capacitance insulating film 805, a lower electrode 806, a rib 807, an upper electrode 809, and a sealing film 810 are laminated in this order from the array substrate 801 side. Further, the ITO layer 804 and the lower electrode 806 are electrically connected via an opening part 902 of the capacitance insulating film 805. In a region on the right side of FIG. 9 where the line 802 is formed, primarily, the line 802, the planarizing film 803, the capacitance insulating film 805, the rib 807, the upper electrode 809, and the sealing film 810 are laminated in this order from the array substrate 801 side.

In a region where the pixel opening 902 is formed, primarily, the planarizing film 803, the ITO layer 804, the capacitance insulating film 805, the lower electrode 806 of an organic EL film 808, the organic EL film 808, the upper electrode 809 of the organic EL film 808, and the sealing film 810 are laminated in this order from the array substrate 801 side. Note that "903" in FIG. 9 represents a border of the pixels.

SUMMARY OF THE INVENTION

Figure 10:
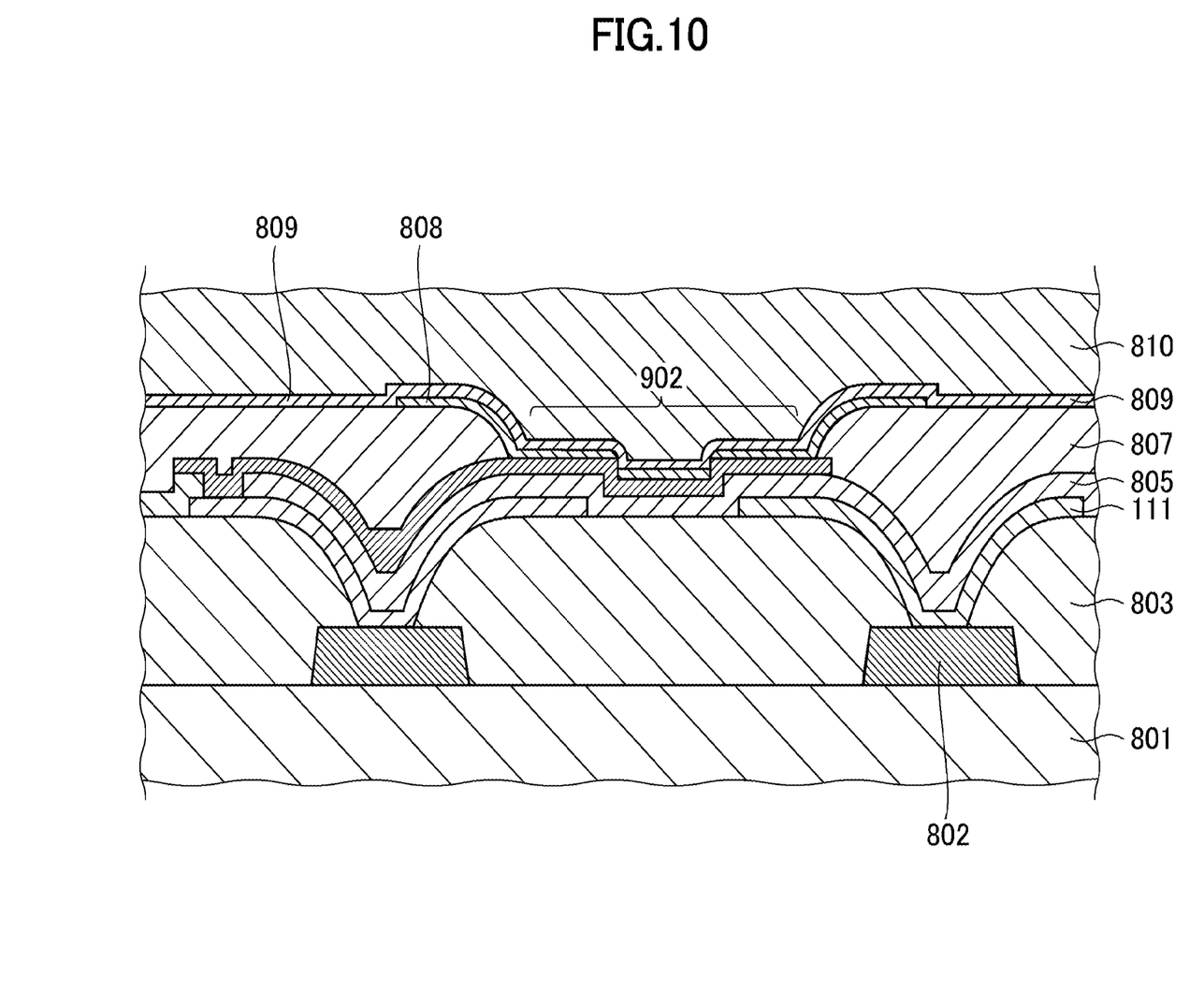
FIG. 10 is a diagram for explaining the problem of the present invention.
Figure 11:
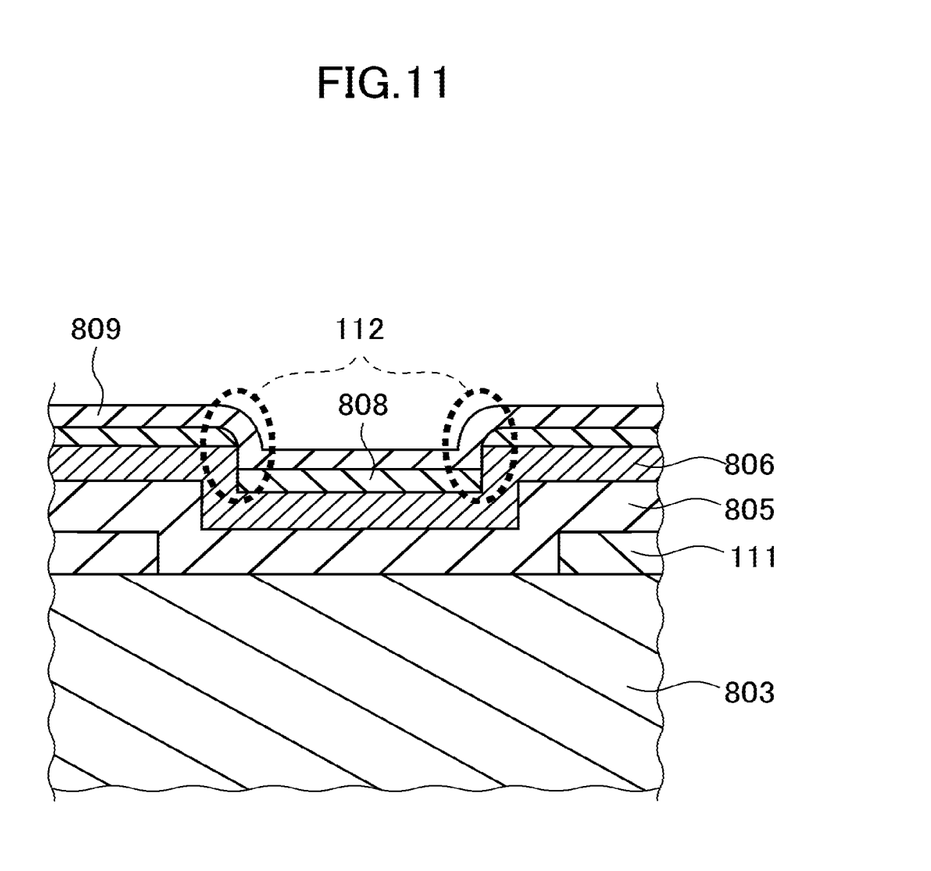
FIG. 11 is a diagram for explaining the problem of the present invention.

Here, for effectively utilizing the ITO layer 804 formed under the pixel opening 902 as described above, as illustrated in FIG. 10, it is thinkable to divide the ITO layer 804 in FIG. 8 and form a holding capacitance of a pixel circuit by the divided ITO layer 111, the capacitance insulating film 805, and the lower electrode 806. However, if the ITO layer 804 is divided, as illustrated in FIG. 11, a step part 112 is generated on the lower electrode 806 that is formed over the divided part of the ITO layer 111, and the upper electrode 809 and the lower electrode 806 might be short circuited at the step part 112.

Regarding this, one or more embodiments of the present invention are intended to realize an organic EL display device that can prevent a short circuit between the upper electrode and the lower electrode of the organic EL film over the divided part even in a case where the ITO layer is disposed to be divided as described above.

(1) An organic EL display device according to one or more embodiments of the present invention includes: an ITO layer divided and disposed in a region where a pixel opening is formed; a capacitance insulating film disposed on the ITO layer; a lower electrode disposed on the capacitance insulating film; an organic layer disposed on the lower electrode; an upper electrode disposed on the organic layer; and a planarizing member disposed so as to soften a step of a step part of the lower electrode.

(2) In the organic EL display device as described in (1) above, the planarizing member is formed of acryl.

(3) In the organic EL display device as described in (1) above, the ITO layer is divided by the capacitance insulating film, and the step part is positioned over a divided part of the ITO layer.

(4) In the organic EL display device as described in (1) above, a first ITO layer of the divided ITO layers forms a holding capacitance in corporation with the lower electrode and the capacitance insulating film.

(5) In the organic EL display device as described in (1) above, a second ITO layer of the divided ITO layers is connected to the lower electrode.

(6) An organic EL display device according to one or more embodiments of the present invention includes: an ITO layer divided and disposed in a region where a pixel opening is formed; a capacitance insulating film disposed on the ITO layer; a lower electrode disposed on the capacitance insulating film; an organic layer disposed on the lower electrode; an upper electrode disposed on the organic layer; and a planarizing member disposed at an edge of a step part of the lower electrode.

(7) In the organic EL display device as described in (6) above, the lower electrode and the organic layer are in direct contact with each other at the step part.

DETAILED DESCRIPTION OF THE INVENTION

Below, one or more embodiments of the present invention are explained with reference to the accompanying drawings. The disclosed embodiments are merely examples, and appropriate variations within the spirit of the present invention that can be easily arrived at by those skilled in the art are naturally included in the scope of the present invention. Further, while the width, thickness, shape, and the like of each part in the drawings may be illustrated schematically as compared with actual embodiments in order to clarify the explanation, these are merely examples and an interpretation of the present invention should not be limited thereto. Furthermore, in the specification and respective drawings, the same reference symbols may be applied to elements similar to those that have already been illustrated in another drawing and a detailed explanation of such elements may be omitted as appropriate.

Figure 1:
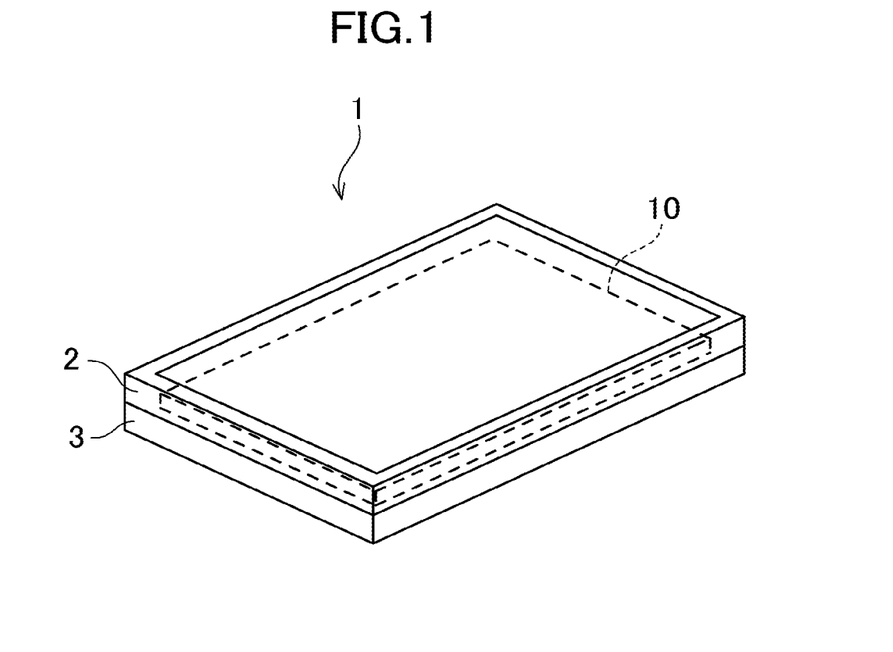
FIG. 1 is a schematic diagram illustrating an organic EL display device according to an embodiment of the present invention.

FIG. 1 is a schematic diagram illustrating an organic EL display device according to an embodiment of the present invention. An organic EL display device 1 is composed of an upper frame 2, a lower frame 3, an organic EL 10 panel fixed so as to be sandwiched by the upper frame 2 and the lower frame 3. Note that the schematic diagram illustrated in FIG. 1 is merely an example, and one or more embodiments of the present invention are not limited thereto.

Figure 2:
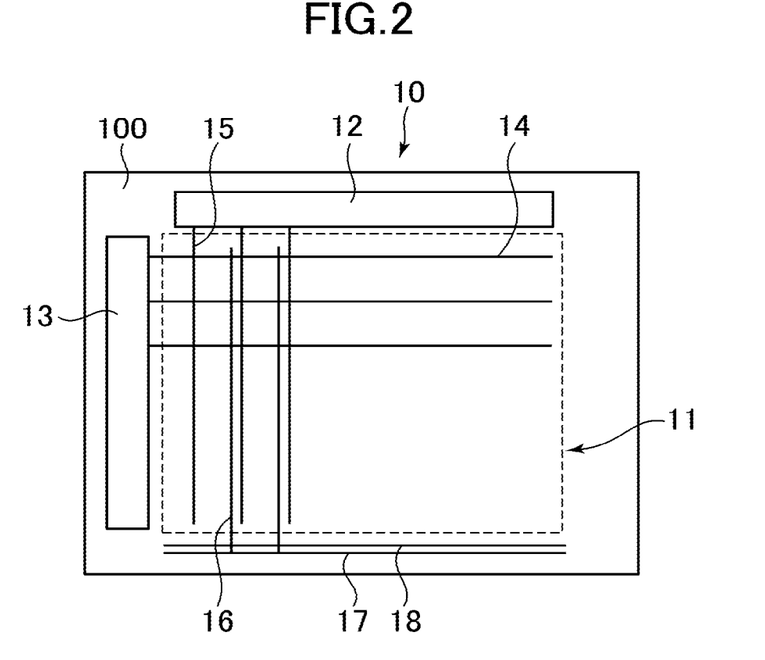
FIG. 2 is a diagram for illustrating an overview of a circuit configuration of the organic EL display device illustrated in FIG. 1.

FIG. 2 is a diagram illustrating an overview of a circuit configuration of the organic EL display device illustrated in FIG. 1. The organic EL panel 10 controls respective pixels formed in a display region 11 on a substrate 100 by a data driving circuit 12 and a gate driving circuit 13 and displays an image. Here, for example, the data driving circuit 12 is an IC (Integrated Circuit) that generates and transmits a data signal to be delivered to the respective pixel, and the gate driving circuit 13 is an IC that generates and transmits a gate signal to be delivered to a TFT (Thin Film Transistor) provided in a pixel. Note that in FIG. 2, the data driving circuit 12 and the gate driving circuit 13 are described as something formed in two places, but they may be incorporated in one IC.

A gate line 14 that transmits a signal from the gate driving circuit 13 is connected to a gate electrode of a switch transistor to be described later. Further, a data line 15 that transmits a signal from the data driving circuit 12 is connected to a source/drain electrode of the switch transistor. To an electric potential line 16, a reference electric potential is applied to make the organic light emitting diode emit light, and the electric potential line 16 is connected to a source/drain electrode of a driver transistor. A first electric potential supply line 17 and a second electric potential supply line 18 are connected to an electric potential supply source, and are connected to the electric potential supply line 16 via the transistor. Note that the circuit configuration illustrated in FIG. 2 is just an example, and the present embodiment is not limited to the above.

Figure 3A:
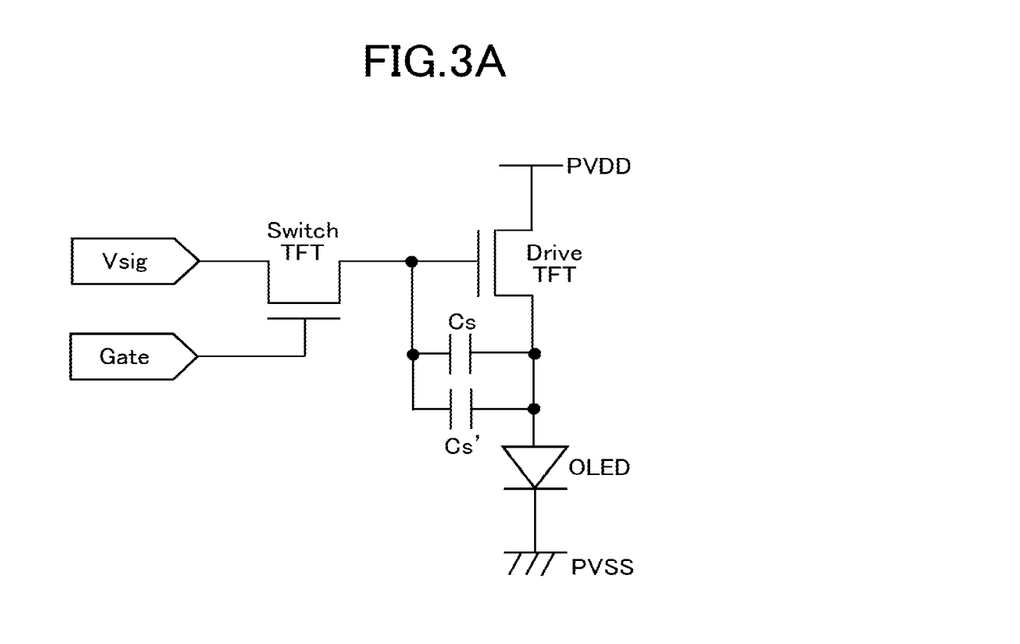
FIG. 3A is a diagram illustrating an example of a pixel circuit of the organic EL display device illustrated in FIG. 1.

FIG. 3A is a diagram illustrating an example of a pixel circuit of the organic EL display device illustrated in FIG. 1. Here, the pixel circuit corresponds to, for example, a region partitioned by the gate line 14 and the data line 15 of FIG. 2. Further, note that in FIG. 3A "Gate" corresponds to the gate line 14 and "Vsig" corresponds to the data line 15. Further, an electric potential of the first electric potential line 17 or the second electric potential line 18 is supplied to a PVDD or a PVSS via the electric potential line 16.

As illustrated in FIG. 3A, a pixel circuit in the present embodiment includes, for example, a switch transistor (Switch TFT), a driver transistor (Drive TFT), a storage capacitance (Cs), and an organic light emitting diode (OLED).

The gate line 14 is connected to the gate electrode of the switch transistor, and the data line 15 is connected to one of the source and drain electrodes of the switch transistor. To the gate of the driver transistor the other one of the source and drain electrodes of the switch transistor is connected, to one of the source and drain electrodes of the driver transistor the PVDD is supplied, and the other one of the source and drain electrodes of the driver transistor is connected to the other one of the source and drain electrodes of the switch transistor via the storage capacitance. The organic light emitting diode is connected to the other one of the source and drain electrodes of the driver transistor and to the PVSS. Further, a holding capacitance (Cs') to be described later is formed in parallel with the storage capacitance.

Next, an overview of an operation of the pixel circuit in the present embodiment is given. When a signal is applied to the gate line 14 from the gate driving circuit 13, a switch transistor is turned to the ON state. Then, if a signal is applied to the data line 15 from the data driving circuit 12, electric charge is stored in the storage capacitance and the holding capacitance, and a voltage is applied to the gate electrode of the driver transistor, to turn it to the ON state. Here, even in the case where the switch transistor is turned to the OFF state, due to the charge stored in the storage capacitance and the holding capacitance, the driver transistor is in the ON state for a certain period of time. Since an anode of the organic light emitting diode is connected to the electric potential line 16 via the source and the drain of the driver transistor, and a cathode of the organic light emitting diode is at the reference electric potential PVSS, an electric current flows in the organic light emitting diode 40 depending on the gate voltage of the driver transistor and the organic light emitting diode emits light.

Figure 3B:
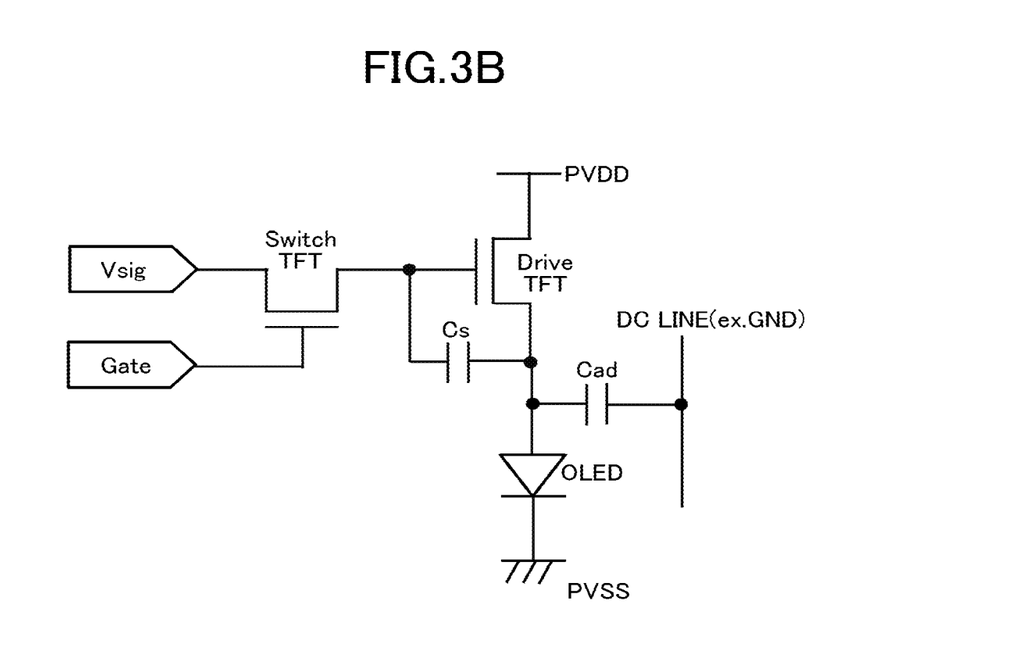
FIG. 3B is a diagram illustrating another example of the pixel circuit of the organic EL display device illustrated in FIG. 1.

A pixel circuit of the present invention may be configured, for example, as illustrated in FIG. 3B. Below, explanations are not given as to the points similar to those in FIG. 3A. In the pixel circuit in FIG. 3B, unlike in the case of FIG. 3A, a holding capacitance (Cad) is formed between the anode of the organic light emitting diode and a DC line. The DC line is, for example, a PVSS or a ground (GND). In this case, the holding capacitance exhibits an effect of stabilizing a voltage written into the storage capacitance, and contributes to a stable operation of the organic light emitting diode. Specifically, that effect is exhibited by configuring that an electrostatic capacitance of the additional capacitance is larger than that of the storage capacitance. Note that the circuit configurations illustrated in FIGS. 3A and 3B are merely examples, and the present embodiment is not limited to the above.

Figure 4:
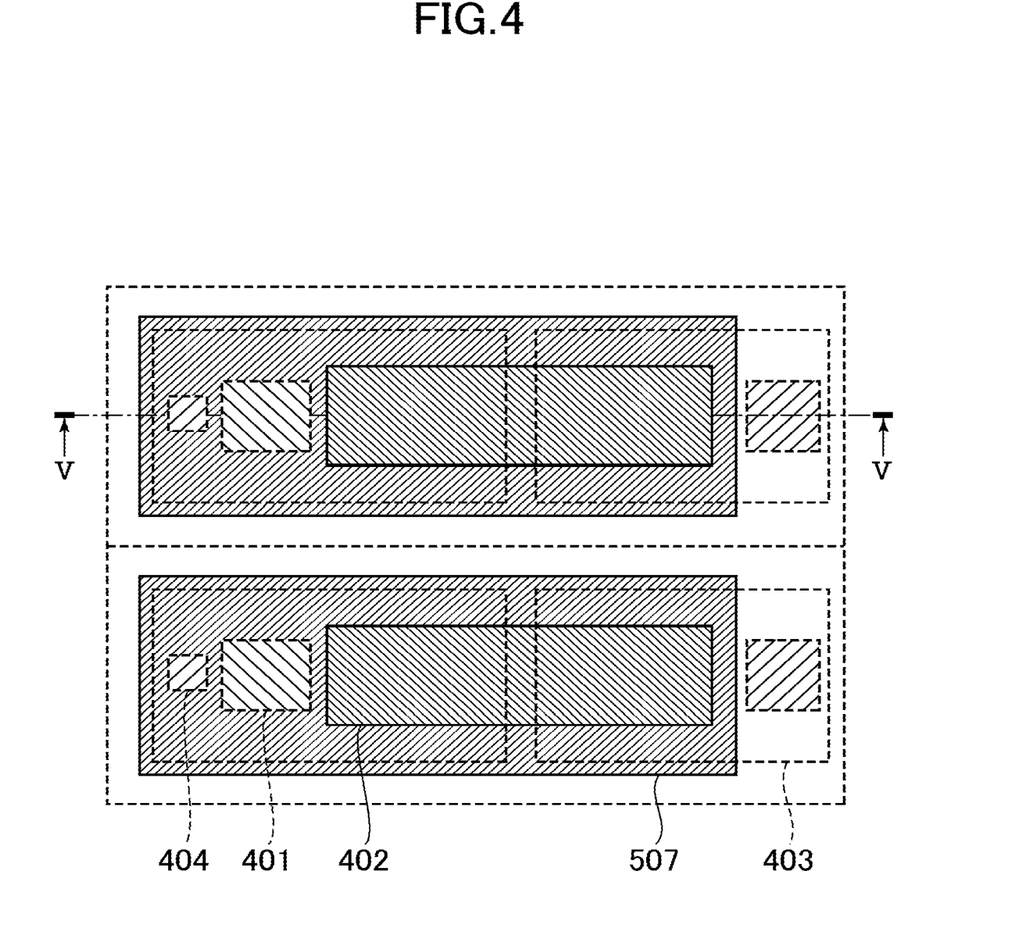
FIG. 4 is a diagram illustrating an example of a planar configuration around a pixel of the organic EL display device in the present embodiment.
Figure 5:
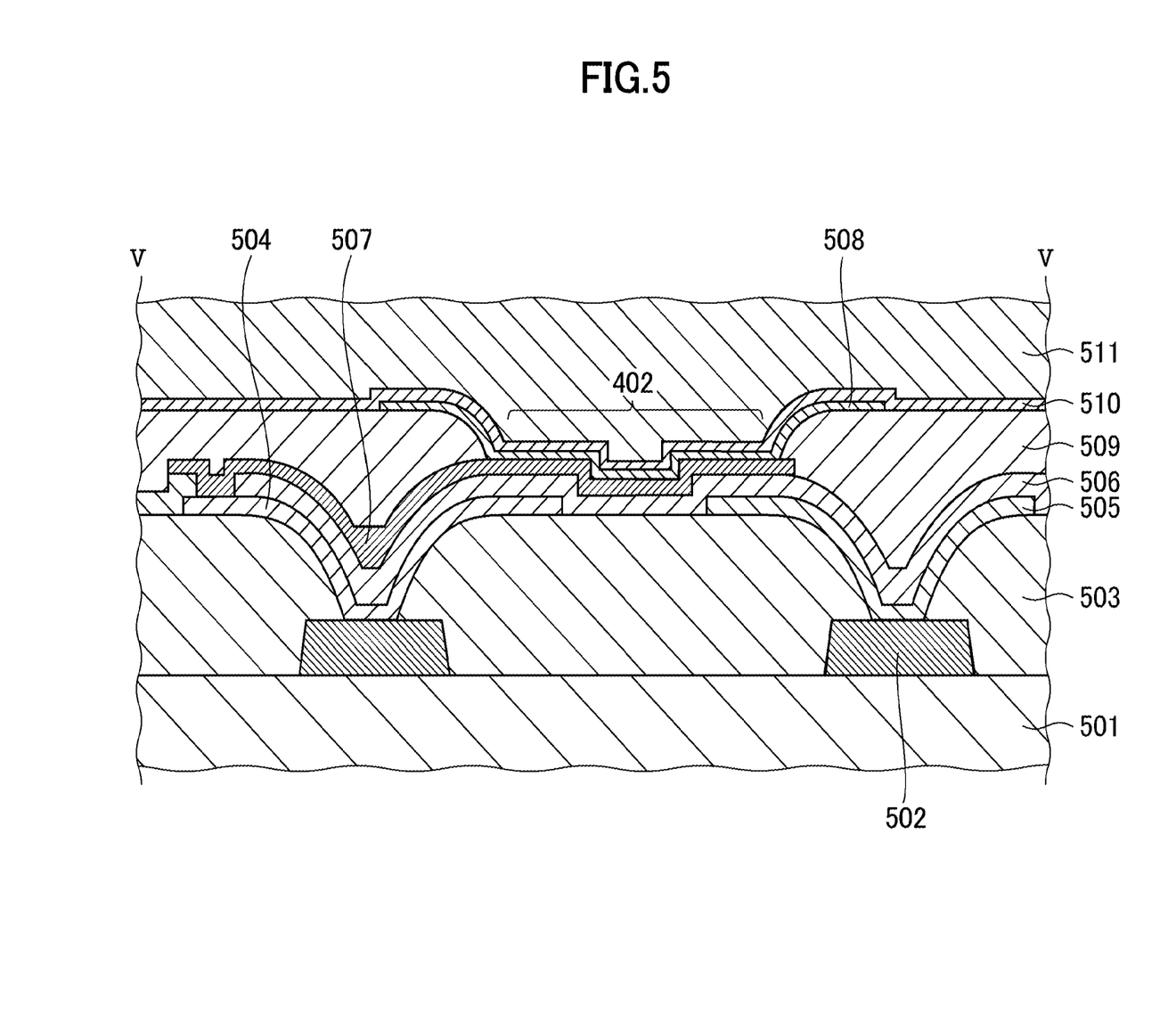
FIG. 5 is a diagram illustrating an example of V-V cross section of FIG. 4.
Figure 6:
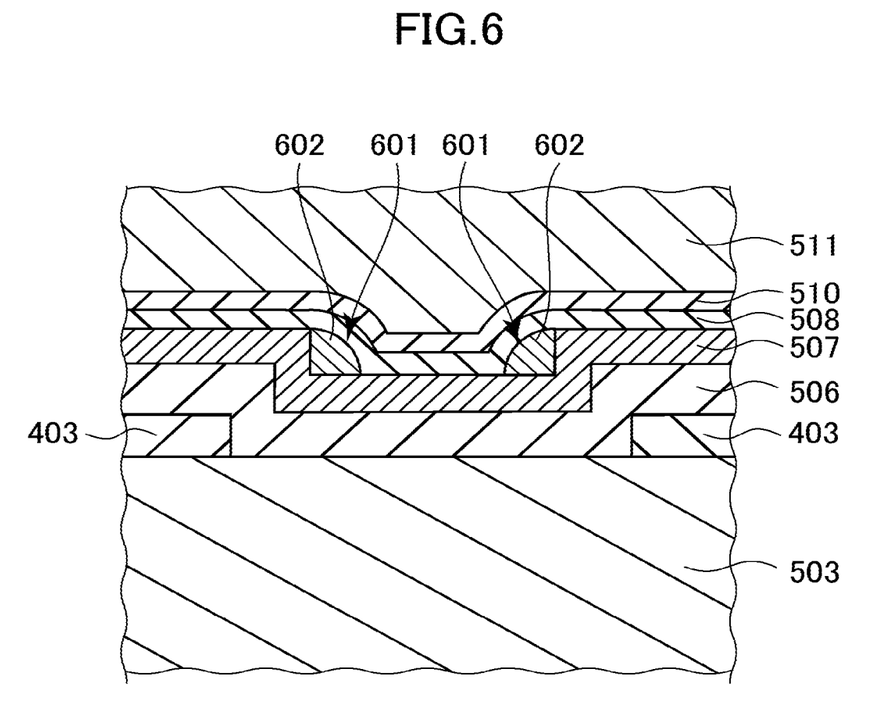
FIG. 6 is a diagram magnifying a part of the cross section of a divided part of the ITO layer illustrated in FIG. 5.

FIG. 4 is a diagram illustrating an example of a planar configuration around a pixel of the organic EL display device in the present embodiment. Further, FIG. 5 is a diagram illustrating an example of V-V cross section of FIG. 4. In FIG. 5, for simplifying the illustration, a planarizing member 602 illustrated in FIG. 6 is not given.

As illustrated in FIGS. 4 and 5, a line 502 is disposed on an array substrate 501 at predetermined intervals. On the array substrate 501 where the line 502 is formed, a planarizing film 503 is formed.

On the planarizing film 503, a planarizing film opening part 401 is provided over the line 502, and over the planarizing film opening part 401 an ITO layer 403 is disposed. Here, the ITO layer 403 is divided approximately at the center of a pixel opening 402 and is disposed. Note that below, one (at the left side in the figure) of the divided ITO layers 403 is referred to as a first ITO layer 504, and the other one (at the right side of the figure) of the divided ITO layers 403 is referred to as a second ITO layer 505. Further, on the ITO layer 403 a capacitance insulating film 506 is disposed, and on the capacitance insulating film 506 a lower electrode 507 of an organic EL film (an organic layer) 508 is disposed. On the capacitance insulating film 506 a capacitance insulating film opening part 404 is provided, and the lower electrode 507 is connected to the first ITO layer 504 via the capacitance insulating film opening part 404. Further, the second ITO layer 505 forms the holding capacitance as described above in corporation with the lower electrode 507 and the capacitance insulting film 506.

A rib (bank) 509 is formed on both of the sides of the pixel opening 402 in FIGS. 4 and 5, and an opening of the rib 509 corresponds to the pixel opening 402. In a region where the pixel opening 402 is formed, the organic EL film 508 is formed so as to cover a part of the lower electrode 507 and the rib 509, and an upper electrode 510 is formed so as to cover the organic EL film 508. Further, a sealing film 511 is formed so as to cover the upper electrode 510. Note that since a configuration of a layer over the sealing film is the same as that of an ordinary organic EL display device, an explanation of it is not given.

FIG. 6 is a diagram magnifying a part of the cross section of the divided part of the ITO layer illustrated in FIG. 5. As illustrated in FIG. 6, at a step part 601 of the lower electrode 507, a planarizing member 602 is arranged so as to soften a step of the step part (e.g., at an edge of the step part). Here, the planarizing member 602 is formed of, for example, polymer resin such as acryl. Specifically, when the planarizing member 602 in a liquid form is dripped on the lower electrode 507, the planarizing member 602 in a liquid form coheres at the step part 601 by surface tension. Then, by curing the planarizing member 602 in a liquid form by an ultraviolet ray, the planarizing member 602 is formed selectively at the step part 601. Next, on the lower electrode 507 on which the planarizing member 602 is formed, the organic EL film 508 and the upper electrode 510 are disposed in this order. By this arrangement, adherence of the organic EL film 508 to the lower electrode 507 at the step part 601 improves, and a short circuit between the upper electrode 510 and the lower electrode 507 at the step part 601 can be suppressed.

Figure 7:
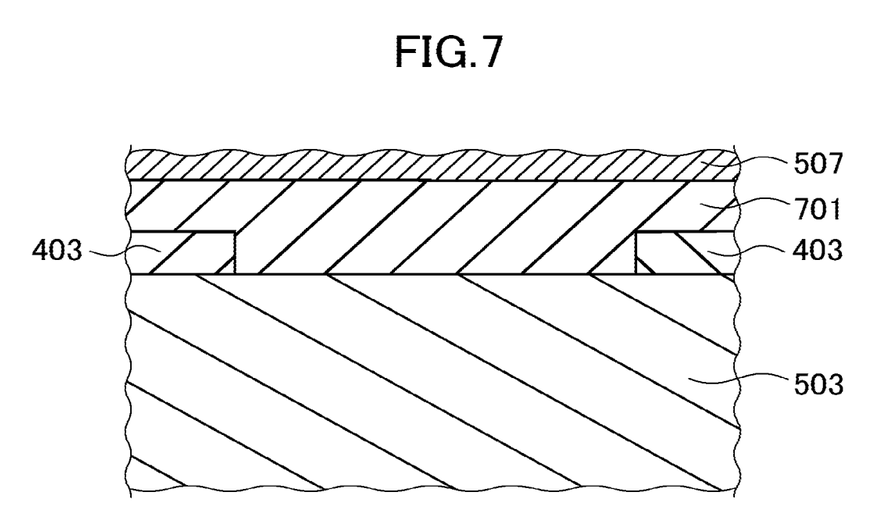
FIG. 7 is a diagram for explaining a variation in the present embodiment.

The present invention is not limited to the above embodiments, but it accepts replacement with a configuration substantially the same with those illustrated as to the above embodiments, a configuration that exhibits the same working effect, or a configuration that can achieve the same goal. For example, it may be configured that as illustrated in FIG. 7, a capacitance insulating film 701 formed on the ITO layer 403 that is divided and disposed is formed as an organic planarizing film or a lamination structure of an organic planarizing film and an inorganic layer, so as not to generate the step part 601 at the lower electrode 507 disposed over the divided part of the ITO layer 403. Note that in FIG. 7, a configuration of a layer over the lower electrode 507 is the same as that of an ordinary organic EL display device, an illustration of it is not given.

Those skilled in the art should be able to arrive at various kinds of variations and modifications within the spirit of the present invention, ant it is understood that such variations and modifications are within the scope of the present invention. For example, addition, deletion, or design change of components, or by addition, omission, or condition change of processes made by those skilled in the art as appropriate in each embodiment as described above are also encompassed within the scope of the present invention as long as they fall within the spirit of the present invention.

What is claimed is:

1. An organic EL display device comprising:
   an ITO layer divided and disposed in a region where a pixel opening is formed;
   a capacitance insulating film disposed on the ITO layer;
   a lower electrode disposed on the capacitance insulating film;
   a rib disposed on the lower electrode;
   an organic layer disposed on the lower electrode;
   an upper electrode disposed on the organic layer; and
   a planarizing member on the lower electrode, wherein
   an edge of the ITO layer overlaps the pixel opening,
   the lower electrode has a first recess reflecting a shape of the ITO layer,
   the planarizing member is inside the first recess, and
   all sides of the planarizing member are covered by the organic layer and the lower electrode in a cross-sectional view.

2. The organic EL display device according to claim 1, wherein the planarizing member is formed of acryl.

3. The organic EL display device according to claim 1, wherein the ITO layer is divided by the capacitance insulating film,
   the first recess includes a step part, and
   the step part is positioned over a divided part of the ITO layer.

4. The organic EL display device according to claim 1, wherein a first ITO layer of the divided ITO layers forms a holding capacitance in corporation with the lower electrode and the capacitance insulating film.

5. The organic EL display device according to claim 1, wherein a second ITO layer of the divided ITO layers is connected to the lower electrode.

6. An organic EL display device comprising:
   an ITO layer divided and disposed in a region where a pixel opening is formed;
   a capacitance insulating film disposed on the ITO layer;
   a lower electrode disposed on the capacitance insulating film;
   a rib disposed on the lower electrode;
   an organic layer disposed on the lower electrode;
   an upper electrode disposed on the organic layer; and
   a planarizing member disposed on the lower electrode, wherein
   an edge of the ITO layer overlaps the pixel opening,
   the lower electrode has a first recess reflecting a shape of the ITO layer,
   the planarizing member is inside the first recess, and all sides of the planarizing member are covered by the organic layer and the lower electrode in a cross-sectional view.

7. The organic EL display device according to claim 6, wherein the lower electrode and the organic layer are in direct contact with each other at a step part of the first recess.

8. The organic EL display device according to claim 1, the planarizing member is disposed inside the pixel opening in a plan view.

9. The organic EL display device according to claim 8, the planarizing member is disposed without overlapping the rib in the plan view.

10. The organic EL display device according to claim 1, wherein
   a top of the rib is higher than a top of the planarizing member.

11. The organic EL display device according to claim 1, wherein
   the first recess includes a step part,
   a bottom surface of the planarizing member contacts with the lower electrode at the step part, and
   a side surface of the planarizing member contacts with the lower electrode at the step part.

12. The organic EL display device according to claim 6, the planarizing member is disposed inside the pixel opening in a plan view.

13. The organic EL display device according to claim 12, the planarizing member is disposed without overlapping the rib in the plan view.

14. The organic EL display device according to claim 6, wherein
   a top of the rib is higher than a top of the planarizing member.

15. The organic EL display device according to claim 6, wherein
   the first recess includes a step part,
   a bottom surface of the planarizing member contacts with the lower electrode at the step part, and
   a side surface of the planarizing member contacts with the lower electrode at the step part.

16. The organic EL display device according to claim 1, further comprising
   a planarizing film and a line, wherein
   the planarizing film is on the line,
   the ITO layer is on the planarizing film.

17. The organic EL display device according to claim 16, wherein
   the planarizing film has an opening,
   the ITO layer in the opening, and
   the ITO layer contacts the line in the opening.

18. The organic EL display device according to claim 1, wherein
   the organic layer has a bottom surface,
   the bottom surface is in contact with the lower electrode and the planarizing member successively.

19. The organic EL display device according to claim 18, wherein
   a step of the bottom surface is gentler than a step of a step part of the first recess.

20. The organic EL display device according to claim 1, wherein
   the capacitance insulating film has a second recess reflecting a shape of the ITO layer, and
   the first recess is located inside the second recess.

* * * * *